United States Patent
Ohta et al.

(10) Patent No.: US 9,718,726 B2
(45) Date of Patent: Aug. 1, 2017

(54) GLASS CERAMIC SUBSTRATE AND PORTABLE ELECTRONIC DEVICE HOUSING USING THE SUBSTRATE

(71) Applicant: ASAHI GLASS COMPANY, LIMITED, Tokyo (JP)

(72) Inventors: Seigo Ohta, Tokyo (JP); Masamichi Tanida, Tokyo (JP); Hideki Numakura, Tokyo (JP); Qing Li, Tokyo (JP)

(73) Assignee: ASAHI GLASS COMPANY, LIMITED, Tokyo (JP)

( * ) Notice: Subject to any disclaimer, the term of this patent is extended or adjusted under 35 U.S.C. 154(b) by 200 days.

(21) Appl. No.: 14/706,406

(22) Filed: May 7, 2015

(65) Prior Publication Data
US 2015/0232375 A1 Aug. 20, 2015

Related U.S. Application Data

(63) Continuation of application No. PCT/JP2013/080106, filed on Nov. 7, 2013.

(30) Foreign Application Priority Data

Nov. 7, 2012 (JP) ................. 2012-245591

(51) Int. Cl.
*C03C 14/00* (2006.01)
*B32B 17/00* (2006.01)

(52) U.S. Cl.
CPC ............ *C03C 14/004* (2013.01); *B32B 17/00* (2013.01); *C03C 2214/04* (2013.01);
(Continued)

(58) Field of Classification Search
None
See application file for complete search history.

(56) References Cited

U.S. PATENT DOCUMENTS

| | | | |
|---|---|---|---|
| 5,296,085 | A | 3/1994 | Faure et al. |
| 2009/0011249 | A1 | 1/2009 | Sakamoto |

(Continued)

FOREIGN PATENT DOCUMENTS

| | | |
|---|---|---|
| CA | 2025037 | 3/1991 |
| CN | 1050366 | 4/1991 |

(Continued)

OTHER PUBLICATIONS

International Search Report issued Feb. 4, 2014 in PCT/JP2013/080106 filed Nov. 7, 2013.

(Continued)

*Primary Examiner* — David Sample
(74) *Attorney, Agent, or Firm* — Oblon, McClelland, Maier & Neustadt, L.L.P.

(57) ABSTRACT

A glass ceramic substrate includes: an inner layer part having a first thermal expansion coefficient; and a surface layer part having a second thermal expansion coefficient smaller than the first thermal expansion coefficient. The inner layer part contains a first glass matrix and flat alumina particles. The flat alumina particles are dispersed in the glass matrix in a direction in which individual thickness directions are substantially perpendicular to a surface direction of one of main surfaces of the inner layer part. Further, a mean aspect ratio of the flat alumina particles is 3 or more in one of cross sections along the thickness directions of the flat alumina particles out of cross sections of the inner layer part.

18 Claims, 2 Drawing Sheets

(52) U.S. Cl.
CPC .... *Y10T 428/131* (2015.01); *Y10T 428/24174* (2015.01); *Y10T 428/26* (2015.01)

(56) References Cited

U.S. PATENT DOCUMENTS

| | | | |
|---|---|---|---|
| 2010/0080981 A1* | 4/2010 | Kobuke | C03C 14/004 428/329 |
| 2010/0151217 A1 | 6/2010 | Kanada et al. | |
| 2011/0092353 A1 | 4/2011 | Amin et al. | |
| 2012/0028018 A1* | 2/2012 | Cho | C03C 14/004 428/220 |
| 2012/0300479 A1 | 11/2012 | Okada et al. | |
| 2014/0177241 A1* | 6/2014 | Ohta | H01L 23/15 362/382 |
| 2015/0010721 A1 | 1/2015 | Tanida et al. | |

FOREIGN PATENT DOCUMENTS

| | | |
|---|---|---|
| CN | 101416570 | 4/2009 |
| CN | 102089252 | 6/2011 |
| CN | 102714259 | 10/2012 |
| DE | 295885 | 11/1991 |
| DE | 69005077 | 5/1994 |
| DK | 425325 | 2/1994 |
| EP | 0425325 | 5/1991 |
| EP | 2026642 | 2/2009 |
| EP | 2533311 | 12/2012 |
| ES | 2060108 | 11/1994 |
| FR | 2652075 | 3/1991 |
| JP | 3-131517 | 6/1991 |
| JP | 6-029664 | 2/1994 |
| JP | 2002-111210 | 4/2002 |
| JP | 2010-147101 A | 7/2010 |
| JP | 2011-527105 | 10/2011 |
| JP | 2011-246330 | 12/2011 |
| JP | 4957723 | 6/2012 |
| KR | 2008-0098528 | 11/2008 |
| KR | 2011-0026508 | 3/2011 |
| KR | 2012-0123023 | 11/2012 |
| WO | WO 2007/142112 | 12/2007 |
| WO | WO 2010/002477 | 1/2010 |
| WO | WO 2011/096126 | 8/2011 |
| WO | WO 2013/133300 | 9/2013 |

OTHER PUBLICATIONS

Office Action issued Jan. 17, 2017 in Japanese Patent Application No. 2014-545748 (with unedited computer generated English translation).

English translation of the International Preliminary Report on Patentability and Written Opinion issued May 21, 2015 in PCT/JP2013/080106.

Office Action issued Feb. 3, 2016 in Chinese Patent Application No. 201380057902.2 (with English language translation).

* cited by examiner

GLASS CERAMIC SUBSTRATE AND PORTABLE ELECTRONIC DEVICE HOUSING USING THE SUBSTRATE

CROSS-REFERENCE TO RELATED APPLICATIONS

This application is a continuation of prior International Application No. PCT/JP2013/080106 filed on Nov. 7, 2013 which is based upon and claims the benefit of priority from Japanese Patent Application No. 2012-245591 filed on Nov. 7, 2012; the entire contents of all of which are incorporated herein by reference.

FIELD

The present invention relates to a glass ceramic substrate and a portable electronic device housing having this glass ceramic substrate.

BACKGROUND

As a wiring substrate used for electronic devices, a glass ceramic substrate constituted of a sintered compact of a composition containing glass powder and ceramic powder is known. A conductive pattern is formed, for example, on a surface of or inside the glass ceramic substrate, and the substrate is mounted as a wiring substrate in an electronic device to be used. Alternatively, the glass ceramic substrate sometimes has no wiring provided thereon in particular to be used as a housing for electronic device such as a portable phone.

In recent years, accompanying size reduction and increase in function of electronic devices, thinning of glass ceramic substrate is also demanded. Moreover, electrode structures are becoming complicated accompanying complication and micronization of circuit boards, and stress applied to a glass ceramic substrate is also increasing. Accordingly, a glass ceramic substrate having a higher strength than conventional ones is demanded now. Further, when it is used for an element mounting substrate for LED or a housing for electronic device or the like, a glass ceramic substrate having a sufficient strength and also having a three-dimensional shape is demanded.

Here, glass and ceramic as a main component of the glass ceramic substrate are both brittle materials and the glass ceramic substrate has a nature that it is inherently weak against shock and a crack easily occurs. Accordingly, attempts have been made hitherto to obtain a glass ceramic substrate that can correspond to thinning and high strength, by selecting one that can contribute to improvement in strength of a glass ceramic substrate as a compounded ceramic powder, or the like.

For example, for the purpose of increasing heat conductivity and increasing strength of the glass ceramic substrate, Patent Reference 1(JP-A 2002-111210) proposes a glass ceramic substrate in which flat ceramic particles having an aspect ratio of 4 or more are dispersed in a glass matrix with a high orientation degree of 50% or more. Here, in the glass ceramic substrate proposed by Patent Reference 1, by using flat ceramic particles, strength property is improved compared to conventional ones. However, we are in a situation where it cannot correspond to high strength property demanded in recent years.

Further, Patent Reference 2(JP-A H06-029664) describes a low temperature fired multilayered ceramic wiring board composed of glass and crystalline material being a residual part, in which a thermal expansion coefficient of its outermost layer is made smaller than that of its inner layer and the total thickness of its outermost surface layer and its outermost rear layer is made smaller than the thickness of the inner layer. By employing such a structure, in a cooling process after firing, compressive stress is generated in the outermost surface layer and the outermost rear layer, so that transverse rupture strength of the multilayered ceramic wiring board improves.

Further, Patent Reference 3(JP-B 4957723) describes a multilayer ceramic substrate having a laminated structure including surface layer portions and an inner layer portion, which uses the concept similar to that of Patent Reference 2. In this substrate, a thermal expansion coefficient of the surface layer portions is smaller than that of the inner layer portion, the difference in thermal expansion coefficient between the surface layer portions and the inner layer portion is 1.0 ppm/K or more, and the weight content of a component common to both a material constituting the surface layer portions and a material constituting the inner layer portion is 75% by weight or more. By employing such a structure, defects such as delamination and voids in an interface portion between the surface layer portion and the inner layer portion and warpage of the substrate are suppressed and substrate strength improves.

However, in Patent Reference 3, in order to improve mechanical strength, a crystallized glass composition in which crystals precipitate as a glass composition is used, and in order to suppress delamination in the interface portion between the surface layer portion and the inner layer portion, a large amount of component common to both the constituting materials needs to be contained. Further, since the crystallized glass composition is used, a dispersion in strength increases because of an amount of crystal to precipitate, a size of crystallite, or the like and firing has to be performed at 980° C., and thus there is caused a problem that silver as a conductor wiring cannot be used.

Further, in Patent References 2 and 3, compressive stress is applied to the outer layer portion, but mechanical strength in the inner layer portion to which tensile stress is applied is weak, so that we are in a situation where Patent References 2 and 3 cannot correspond to high strength property demanded in recent years.

DISCLOSURE OF THE INVENTION

The present invention has been made to solve the above problems, and it is an object thereof to provide a glass ceramic substrate having a sufficiently high strength property.

A glass ceramic substrate of the present invention includes: an inner layer part having a first thermal expansion coefficient; and a surface layer part having a second thermal expansion coefficient smaller than the first thermal expansion coefficient. A crystallinity of the glass ceramic substrate is 25% or less. The inner layer part contains a first glass matrix having a crystallinity of 25% or less, and flat alumina particles. The flat alumina particles are dispersed in the glass matrix in a direction in which individual thickness directions are substantially perpendicular to a surface direction of one of main surfaces of the inner layer part. Further, a mean aspect ratio of the flat alumina particles is 3 or more in one of cross sections along the thickness directions of the flat alumina particles out of cross sections of the inner layer part.

The present invention further provides a glass ceramic substrate, includes: an inner layer part having a first thermal expansion coefficient; and a surface layer part having a second thermal expansion coefficient smaller than the first thermal expansion coefficient, wherein a crystallinity of the glass ceramic substrate is 25% or less, and the inner layer part contains a first glass matrix having a crystallinity of 25% or less, and flat alumina particles having a mean aspect ratio of 3 or more. The present invention further provides a portable electronic device housing using the above glass ceramic substrate.

Note that in this description, unless otherwise noted in particular, substantially perpendicular refers to being recognizable as perpendicular, at a visual observation level in an image analysis screen by a microscope or the like or in actual observation. Further, similarly, a term to which "substantially" is added refers to "being recognizable" at a visual observation level.

According to the present invention, it is possible to provide a glass ceramic substrate provided with a high strength property demanded in recent years.

DETAILED DESCRIPTION

Hereinafter, there will be explained an embodiment of the present invention in detail.

[Glass Ceramic Substrate]

A glass ceramic substrate of the present invention is constituted of an inner layer part having a first thermal expansion coefficient and a surface layer part having a thermal expansion coefficient smaller than the first thermal expansion coefficient, and is formed in such a method that the inner layer part is sandwiched between the surface layer parts.

The inner layer part is obtained by firing a first green sheet made of a first glass ceramic composition containing a first glass powder (to form a first glass matrix after firing) and flat alumina particles having a mean aspect ratio of 3 or more as a filler. The surface layer part is obtained by firing a second green sheet or a paste made of a second glass ceramic composition containing a second glass powder (to form a second glass matrix after firing).

Specifically, the second green sheet is layered on both upper and lower surfaces of the first green sheet to then be fired at 800 to 900° C., and thereby the glass ceramic substrate is obtained. When a paste is used, the paste is applied on one surface of the first green sheet and is dried and then the paste is applied on the other surface of the first green sheet and is dried to be fired at 800 to 900° C., and thereby the glass ceramic substrate is obtained.

Incidentally, in the first glass ceramic composition, ceramic particles other than the flat alumina particles, which have 80% or more of transmittance in a visible range of 380 to 780 nm, and a filler such as a coloring inorganic pigment, which has a characteristic in which the filler is absorbed in the visible range and its transmittance becomes less than 80%, can also be contained. Further, in the second glass ceramic composition, ceramic particles other than the above flat alumina particles can also be contained.

Upon firing, the first glass powder contained in the first glass ceramic composition melt, and the flat alumina particles are dispersed in this molten glass. At this time, in the firing process, the vicinity of a surface of a flat alumina particle sometimes liquates into the molten glass. By this liquation, the size of the flat alumina particles in the first glass matrix after firing decreases compared to that before firing, but regarding the mode of a flat body, the mode of a raw material before firing is mostly maintained after firing. Further, in the firing process, alumina components that liquated from the flat alumina particles disperse in the molten glass, and thus the first glass matrix obtained after firing has a composition in which the alumina components of the liquated amount are added to the glass composition of the first glass powder.

The inner layer part preferably has a characteristic in which the above flat alumina particles are dispersed in the first glass matrix with a crystallinity of 25% or less and an open porosity is 5% or less. This makes it possible to stably obtain the glass ceramic substrate having a sufficiently high strength property.

Upon firing, the second glass powder contained in the second glass ceramic composition melt to adhere to the inner layer part. The second glass ceramic composition having a thermal expansion coefficient smaller than that of the first glass ceramic composition is used, and thereby compressive stress caused by the difference in thermal expansion coefficient occurs in the surface layer part when the temperature decreases after firing. By this compressive stress, the glass ceramic substrate can obtain a strength property higher than that of a fired body obtained only by the inner layer part using the flat alumina particles.

Here, crystallinity X (%) of the glass constituting the glass matrix of the glass ceramic body can be calculated by the following calculation formula (1) from an X-ray diffraction spectrum of powders of the glass ceramic body measured with an X-ray diffraction apparatus.

$$X = I(\text{glass})/\{I(Al_2O_3) + I(\text{glass})\} \times 100 \qquad (1)$$

In the formula (1), I(glass) denotes the maximum intensity of a peak of X-ray diffraction of crystallized glass, and $I(Al_2O_3)$ denotes the maximum intensity of a peak of X-ray diffraction of alumina. Note that a characteristic X ray can be measured by using a CuKα ray.

In this description, the crystallinity of glass refers to one measured by the above method. In the present invention, the crystallinity of the glass matrix constituting the glass ceramic substrate is 25% or less.

When the glass matrix is partially crystallized, there is caused a risk that a crack proceeds from a boundary between glass and a crystal phase and strength decreases. Further, crystals separate, to thereby cause a risk that interdiffusion of glass components is suppressed between the inner layer part and the surface layer part and defects such as delamination and voids caused by the difference in thermal expansion coefficient occur. Next, when crystals of a glass separate during firing, a softening point of residual glass may decrease, decomposition of binder components, which will be described later, cannot be performed sufficiently, and blackening may occur. Further, dispersibility of the flat alumina particles may deteriorate, and a compounding amount may be restricted. Moreover, control of separation of crystals is difficult, and a dispersion may occur in the strength of glass ceramic body due to a dispersion in separation of crystals.

From a viewpoint of preventing such problems, in the glass matrix formed in the above firing process, crystals are preferred not to generate. Specifically, the matrix is preferred to be amorphous, in which no peak of crystallized glass is detected by X-ray diffraction and the crystallinity is 0%.

However, when the glass ceramic substrate is manufactured in an environment where manufacturing conditions are sufficiently controlled, in the glass matrix, crystal phases may also be contained to a certain level. Specifically, the glass matrix may contain crystal phases as long as the crystallinity is 25% at most, and the crystallinity is preferably 20% or less, and more preferably 15% or less. Note that adjustment of the crystallinity of the glass matrix is done by a method which will be described later. One example of the above manufacturing conditions is the case when the glass ceramic substrate is manufactured while it is controlled so that separation of crystals occurs evenly at the stage that binder components are decomposed sufficiently in the process of manufacturing.

Further, in this description, the open porosity of the glass ceramic substrate of the present invention is an open porosity (%) calculated by using an Archimedes method according to JIS R1634, and is preferably 5% or less. By setting the open porosity of the glass ceramic substrate to 5% or less, destruction due to stress concentration to a crack existing in the glass ceramic substrate can be suppressed, and strength of the glass ceramic substrate can be raised to a sufficiently high level. The open porosity of the glass ceramic substrate is preferably 3% or less, more preferably 1% or less, and particularly preferably 0%. Incidentally, the open porosity of the glass ceramic substrate can be adjusted by the composition of the glass ceramic composition. Specifically, it is done by a method which will be described later.

A three-point bending strength of the inner layer part is preferably greater than 400 MPa. By setting the strength of the inner layer part to greater than 400 MPa, when the glass ceramic substrate is obtained, progress of destruction from the inner layer part can be suppressed and strength of the glass ceramic substrate can be improved. The strength of the inner layer part is more preferably 430 MPa or more, and particularly preferably 450 MPa or more. Further, the strength of the inner layer part is preferably 500 MPa or more, and more preferably 600 MPa or more. Note that the three-point bending strength in this description refers to the three-point bending strength that can be obtained by a method complying with JIS C2141.

Hereinafter, there will be explained the flat alumina particles, the first glass powder, and the first glass ceramic composition constituting the inner layer part.

(Flat Alumina Particles)

The flat alumina particles used for the first glass ceramic composition are particles having a mean aspect ratio of 3 to 18, a mean thickness of 0.4 μm or more, and a mean major axis of 10 μm or less for example.

In general, the aspect ratio of a particle is defined as a value obtained by dividing the maximum diameter of the particle by the minimum diameter. Here, a flat particle like the flat alumina particles used in the present invention has a flat shape, and thus its minimum diameter corresponds to the length in a thickness direction of the particle, that is, a "thickness". Further, the maximum diameter of the flat particle corresponds to a "major axis in a flat surface" of the particle. In this description, the minimum diameter of the flat particle is referred to as a "thickness" and the maximum diameter is simply referred to as a "major axis." Therefore, the aspect ratio is a value obtained by dividing the major axis of the flat particle by its thickness. The mean thickness, the mean major axis, and the mean aspect ratio of the flat particle presented in this description refer to ones calculated by averaging values of length measurement of 100 flat particles using a scanning electron microscope (SEM).

In the present invention, it is also possible to use one in which plural kinds of flat alumina particles whose mean thickness, mean major axis, and mean aspect ratio are in the above ranges are mixed. In this case, a value obtained from the sum of values obtained by multiplying mean aspect ratios of the respective flat alumina particles and the ratio of existence thereof can be employed as the mean aspect ratio. Note that the same is true for the mean thickness and the mean major axis. By setting the mean aspect ratio of the flat alumina particles used for the inner layer part to 3 or more, a direction in which a crack progresses can be deflected (stress can be dispersed), so that strength of the inner layer part improves.

The mechanism of destruction of the glass ceramic substrate is generally known such that a crack existing in a surface of the glass ceramic substrate or a crack existing inside the glass ceramic substrate becomes a stress concentration source, and the the glass ceramic substrate is destructed by the progress of this crack. Particularly, to the glass ceramic substrate of the present invention, stress is intentionally added for the purpose of strength improvement, and unless there is mechanical strength sufficiently in the inner layer part in which tensile stress acts, destruction occurs from the inner layer part, so that there is a risk that the effect obtained after the surface layer part is strengthened by compressive stress cannot be obtained sufficiently.

However, when a destruction strength of an anisotropic material itself such as the flat alumina particle is low, the crack proceeds by destruction of the anisotropic material, and there is a risk that strength cannot be improved. Therefore, in addition to the limitation of the "mean aspect ratio of 3 or more," the flat alumina particles limited to the mean thickness of 0.4 μm or more, the mean major axis of 10 μm or less, and the mean aspect ratio of 3 to 18 are preferably used.

When the mean thickness of the flat alumina particles before firing is 0.4 μm or more, even when a surface vicinity portion thereof liquates into the molten glass during firing and they become flat alumina particles reduced in size after firing, the strength of itself is sufficient, and strength of the inner layer part can be maintained at a sufficiently high level. Further, when the mean major axis of the flat alumina particles before firing is 10 μm or less, even dispersion of the flat alumina particles into the first glass matrix formed from the glass powder and components derived from liquated alumina, can be achieved in the obtained inner layer part. When the mean aspect ratio of the flat alumina particles before firing is 3 or more, even when they are flat alumina particles reduced in size after firing, crack extension in the inner layer part can be deflected, and strength of the inner layer part can be raised to a sufficiently high level. On the other hand, when the mean aspect ratio before firing is 18 or less, even dispersion of the flat alumina particles into the first glass matrix formed from the glass powder and components derived from liquated alumina, can be achieved. Incidentally, of the flat alumina particles after firing, the mean thickness is preferably 0.3 μm or more, and the mean major axis is preferably 8 μm or less.

Further, by setting the content of the flat alumina particles relative to the total amount of the first glass ceramic composition to 25 vol % or more, strength of the inner layer part can be raised to a sufficiently high level. When the content of the flat alumina particles is large, there is a risk that bubbles remain in the glass ceramic substrate due to decrease in sinterability of the inner layer part and strength decreases. The flat alumina particles can be contained in the range that makes the open porosity be 5% or less in the obtained inner layer part. From such an aspect, the content of the flat alumina particles is preferably 53 vol % or less, and more preferably 50 vol % or less relative to the total amount of the first glass ceramic composition of the inner layer part. Note that for the sinterability of the glass ceramic substrate of the inner layer part, the open porosity can be presented as an index. The provision of the open porosity in the glass ceramic substrate of the inner layer part can be achieved by setting the content of the flat alumina particles in the first glass ceramic composition to the above range.

As the flat alumina particles, ones having a mean thickness of 0.4 μm or more, a mean major axis of 6 μm or less, and a mean aspect ratio of 3 to 15 are preferred, and ones having a mean thickness of 0.5 μm or more, a mean major axis of 5 μm or less, and a mean aspect ratio of 4 to 10 are more preferred. The content of the flat alumina particles relative to the total amount of the glass ceramic composition of the inner layer part is preferably 28 vol % or more, and more preferably 30 vol % or more.

Examples of the flat alumina particles include a-alumina type, γ-alumina type, δ-alumina type, θ-alumina type, and the like depending on the type of crystal phase. In the present invention, the α-alumina type whose crystal phase has a corundum type structure is used preferably.

In the present invention, as the flat alumina particles, for example, ones obtained by thermally treating flat boehmite particles obtained by hydrothermal synthesis of aluminum hydroxide are preferably used.

The a crystallization degree Y (%) indicating the ratio of crystal phases that shifted to α-alumina type in the flat alumina particles can be calculated with a formula (2) from a peak height ($I_{25.6}$) of an alumina a phase (012 plane) appearing at the position of 2θ=25.6° and peak heights ($I_{46}$) of a γ phase, η phase, χ phase, κ phase, θ phase, and δ phase appearing at the position of 2θ=46° from an X-ray diffraction spectrum of the flat alumina particles obtained by using a powder X-ray diffraction apparatus using a CuKα ray as a characteristic X ray.

$$Y=I_{25.6}/(I_{25.6}+I_{46})\times100(\%) \quad (2)$$

The α crystallization degree in the flat alumina particles used in the present invention is preferably 80% or more, more preferably 90% or more, still more preferably 95% or more, and particularly preferably 100%. When it is less than 80%, the strength of the flat alumina particles is weak, and the strength as the glass ceramic substrate may also decrease.

(First Glass Powder (First Glass Matrix))

The first glass powder is not particularly limited as long as they are ones that during firing, melt to form the first glass matrix surrounding the flat alumina particles and have a crystallinity of 25% or less. Incidentally, the crystallinity is preferably 20% or less, and more preferably 15% or less. In particular, the first glass matrix is particularly preferably amorphous, which does not have a crystal phase.

The glass composition of the first glass matrix is constituted of a first glass powder component and an $Al_2O_3$ component that liquates from the flat alumina particles. The $Al_2O_3$ component in the glass composition of the glass matrix is the sum of an $Al_2O_3$ component contained in the glass composition of the first glass powder and an $Al_2O_3$ component that liquates from the flat alumina particles, and the components other than the $Al_2O_3$ component are components of the first glass powder. The components other than the $Al_2O_3$ component in the glass composition of the first glass matrix will be explained below.

In the glass composition of the first glass matrix, in order to make the range of the crystallinity be the above range, as the composition excluding $Al_2O_3$, an $SiO_2$—$B_2O_3$ based glass is preferred, an $SiO_2$—$B_2O_3$-MO based (M is alkaline earth metal) glass is more preferred, and an $SiO_2$—$B_2O_3$—CaO based glass is particularly preferred.

The contents of respective components when the composition excluding $Al_2O_3$ is 100% in mole percentage based on oxides in the glass composition of the first glass matrix will be described below. In a glass that is $SiO_2$—$B_2O_3$—CaO based in the composition excluding $Al_2O_3$, in order to make the range of the crystallinity be in the above range, CaO is preferably 10% or more. Similarly, the content of $B_2O_3$ in the $SiO_2$—$B_2O_3$—CaO based glass is preferably 13% or more, and the total content of $SiO_2$, $B_2O_3$, and CaO is preferably 75% or more.

More specifically, as the $SiO_2$—$B_2O_3$—CaO based glass, a composition that contains 40 to 68% of $SiO_2$, 13 to 20% of $B_2O_3$, 10 to 40% of CaO, and 0 to 10% in total of at least one selected from the group consisting of $Na_2O$ and $K_2O$, in which the total content of $SiO_2$, $B_2O_3$, and CaO is 75% or more, is preferred, which are expressed as mol %. A more preferred composition contains 44 to 64% of $SiO_2$, 15 to 18% of $B_2O_3$, 15 to 37% of CaO, and 0 to 5% in total of at least one selected from the group consisting of $Na_2O$ and $K_2O$, in which the total content of $SiO_2$, $B_2O_3$, and CaO is 85% or more. Note that the above glass may contain 0 to 10% in total of at least one selected from the group consisting of MgO, SrO, and BaO.

Note that in the glass composition of the first glass matrix, in order to make the range of the crystallinity be in the above range, the content of $Al_2O_3$ is preferably 3 to 15% in mole percentage based on oxides. This amount is an amount sufficiently satisfied by $Al_2O_3$ that liquated from the flat alumina particles.

Therefore, the glass composition of the first glass powder may contain $Al_2O_3$, but an amount keeping the above range is preferred as the glass composition of the first glass matrix to which $Al_2O_3$ that liquated from the flat alumina particles is added.

The first glass powder preferably has a glass composition as described above with respect to the composition excluding $Al_2O_3$ and the content of $Al_2O_3$. As such a glass composition in the first glass powder, specifically, there is exemplified a composition that contains 40 to 65% of $SiO_2$, 13 to 18% of $B_2O_3$, 10 to 38% of CaO, 0 to 10% of $Al_2O_3$, 0 to 10% in total of at least one selected from the group consisting of MgO, SrO, and BaO, and 0 to 10% in total of at least one selected from the group consisting of $Na_2O$ and $K_2O$, in which the total content of $SiO_2$, $B_2O_3$, and CaO is 70% or more, which are expressed as mol% based on oxides.

The respective components of the first glass powder will be described below. Note that "%" in the description of the glass composition represents a mol% expression based on oxides unless otherwise noted in particular.

$SiO_2$ becomes a network former of the glass, and is an essential component for increasing chemical durability, particularly acid resistance. When the content of $SiO_2$ is 40% or more, acid resistance is sufficiently ensured. Further, when the content of $SiO_2$ is 65% or less, a glass softening point (hereinafter denoted by "Ts") and a glass transition point (hereinafter denoted by "Tg") are adjusted in a moderate range without increasing excessively. The content of $SiO_2$ is preferably 43 to 63%.

$B_2O_3$ is an essential component that becomes a network former of the glass. When the content of $B_2O_3$ is 13% or more, Ts is adjusted in a moderate range without increasing excessively, and stability of the glass is kept sufficiently. On the other hand, when the content of $B_2O_3$ is 18% or less, a stable glass is obtained, and chemical durability is also ensured sufficiently. The content of $B_2O_3$ is preferably 15 to 17%.

CaO is an essential component compounded for improving wettability with the glass and the flat alumina particles, and ensuring sinterability of the glass matrix in the obtained glass ceramic body. When the content of CaO is 10% or more, during firing, the alumina that liquates from the flat alumina particles can be dispersed easily in the molten glass, and sinterability of the glass matrix made of the glass composition in which the alumina that liquated from the flat alumina particle is added to the glass component derived from the first glass powder can be ensured sufficiently. Further, during firing, accompanying that the alumina that liquated from the flat alumina particles disperses in the molten glass derived from the first glass powder, the alumina content in the composition of the molten glass increases, and the softening point decreases. Thus, fluidity of the flat alumina particles increases, and rearrangement of the flat alumina particles in the glass matrix is facilitated.

Even when a dispersion in existence ratio or orientation of the flat alumina particles exists in the state of the green sheet, the dispersion can be improved by the flat alumina particles being rearranged during firing as above. Therefore, a dispersion in strength and warping of the glass ceramic substrate can be suppressed. When the content of CaO is 38% or less, crystallization of the glass of the first glass matrix can be suppressed. The content of CaO is preferably 13 to 35%, and more preferably 15 to 35%.

$SiO_2$ and $B_2O_3$ as a network former and CaO that improves wettability with the flat alumina particles are contained by the above respective ratios, and are compounded so that their total content is 70% or more. When the total content is 70% or more, stability and chemical durability of the glass can be ensured sufficiently and wettability with the flat alumina particles improves, and strength of the glass ceramic substrate can be ensured sufficiently. The total content of $SiO_2$, $B_2O_3$, and CaO is preferably 75% or more, and more preferably 80% or more.

In the first glass powder, $Al_2O_3$ is a component that becomes a network former of the glass, and is a component compounded for increasing stability and chemical durability of the glass. Here, the glass composition of the first glass matrix sometimes contains $Al_2O_3$ that liquated from the flat alumina particles in the process of manufacturing. In the glass composition of the first glass matrix, $Al_2O_3$ is a component that is always contained, but in the first glass powder, $Al_2O_3$ is not an essential component. When the content of $Al_2O_3$ exceeds 10% in the first glass powder, it may impair sinterability of the first glass matrix in the vicinity of an interface with the flat alumina particles. The content of $Al_2O_3$ of the first glass powder is preferably 0 to 7%.

Alkaline earth metal oxides other than CaO such as MgO, SrO, and BaO are also components that can improve wettability with the flat alumina particles while suppressing crystallization of the glass. Further, they are also useful for adjusting Ts and Tg. At least one selected from the group consisting of MgO, SrO, and BaO is a component added as an alkaline earth metal oxide, but is not an essential component. By compounding these alkaline earth metal oxides by a content of 10% or less, Ts and Tg can be adjusted in a moderate range without decreasing excessively.

The alkaline metal oxides such as $K_2O$ and $Na_2O$ are components that decrease Ts and Tg and can suppress phase splitting of the glass, and are components preferred to be added. When the total content of at least one selected from the group consisting of $K_2O$ and $Na_2O$ is 10% or less, it can serve the above function sufficiently without leading to decrease in chemical durability, particularly acid resistance, or decrease in electric insulating performance. The total content of $K_2O$ and $Na_2O$ is preferably 1 to 8%, and more preferably 1 to 6%.

Among the first glass powder, there is preferred a glass powder that has a composition containing 43 to 63% of $SiO_2$, 15 to 17% of $B_2O_3$, 13 to 35% of CaO, 0 to 7% of $Al_2O_3$, and 1 to 6% in total of at least one selected from the group consisting of $Na_2O$ and $K_2O$, in which the total content of $SiO_2$, $B_2O_3$, and CaO is 75% or more, which are expressed as mol % based on oxides.

Note that the first glass powder is not necessarily limited to ones constituted of the above components, and can contain other components within a range satisfying characteristics such as Ts and Tg. When other components are contained, the total content is preferably 10% or less.

According to an application of the obtained glass ceramic substrate, the glass composition of the first glass powder may also be adjusted appropriately in a form that satisfies the performance required in this application. For example, when the glass ceramic substrate is used for a substrate for mounting a light emitting element, it is required to increase reflectivity of light. In such cases, a glass composition may be used that causes the difference between a refractive index of the glass matrix and a refractive index of the flat alumina particles to be large, for example, 0.15 or more, to make scattering in the interface between them be favorable and increase reflectivity.

Such a refractive index of the glass can be calculated by using Appen's coefficient. Additive properties (coefficients) of respective components in a silicate glass containing alkali are presented in Table 1. (Source: A. A. Appen: Chemistry of Glass, Nisso Tsushinsha (1974) pp. 318)

TABLE 1

| Component | Additive Property |
|---|---|
| $SiO_2$ | 1.46~1.48 |
| $B_2O_3$ | 1.46~1.71 |
| $Al_2O_3$ | 1.52 |
| MgO | 1.61 |
| CaO | 1.73 |
| SrO | 1.78 |
| $Na_2O$ | 1.59 |
| $K_2O$ | 1.58 |
| $TiO_2$ | 2.13 |
| $ZrO_2$ | 2.2 |
| LiO | 1.7 |
| ZnO | 1.71 |

The first glass powder used in the present invention are obtained by compounding and mixing glass raw materials to make a glass as described above, a glass is produced by a melting method, and the obtained glass is pulverized by a dry grinding method or a wet grinding method. In the case of the wet grinding method, water or ethyl alcohol is used preferably as a solvent. For the grinding, a pulverizer such as a roll mill, a ball mill, or a jet mill, for example can be used.

Fifty percent particle diameter ($D_{50}$) of the first glass powder is preferred to be 0.5 to 2 µm. When $D_{50}$ of the first glass powder is less than 0.5 µm, the first glass powder aggregates easily and become difficult to handle, and moreover they become difficult to be evenly dispersed. On the other hand, when $D_{50}$ of the first glass powder exceeds 2 µm, there may occur increase in Ts or insufficient sintering. The particle diameter may be adjusted by, for example, performing classification as necessary after pulverization. Note that $D_{50}$ of the powders in this description is obtained by a particle diameter measuring apparatus (made by Nikkiso, product name: MT3100II) by a laser diffraction/scattering method.

(First Glass Ceramic Composition)

The first glass ceramic composition contains the flat alumina particles and the first glass powder as an essential component described above. The ratio of the flat alumina particles relative to the total amount of the first glass ceramic composition is 25 vol % or more, preferably 28 vol % or more, and more preferably 30 vol % or more. On the other hand, as the ratio of the flat alumina particles, although they may be contained in a range that makes the open porosity of the glass ceramic substrate after firing be 5% or less, preferably it is 53 vol % or less, and more preferably 50 vol % or less as an upper limit. Further, as the thermal expansion coefficient of the inner layer part obtained from the first glass ceramic composition, for example, $40 \times 10^{-7}$/K to $100 \times 10^{-7}$/K can be used preferably. Incidentally, the thermal expansion coefficient presented in this description refers to a thermal expansion coefficient obtained by the method according to JIS R-3102.

Here, the first glass ceramic composition may contain ceramic particles other than the flat alumina particles according to an application of the obtained glass ceramic substrate in a range that does not impair effects of the present invention. Specifically, examples include alumina particles with a mean aspect ratio of less than 3 (hereinafter described as irregular alumina particles), and ceramic particles such as silica, zirconia, titania, magnesia, mullite, aluminum nitride, silicon nitride, silicon carbide, forsterite, and cordierite, for which a shape such as flat or irregular is of no object in particular. These ceramic particles are white materials, so that the obtained inner layer part can be made white. Among others, use of zirconia powders is preferred when white high reflectivity is required as in the above substrate for mounting a light emitting element.

A compounding amount of such ceramic particles other than the flat alumina particles in the first glass ceramic composition just needs to be an amount that does not impair effects of the present invention, specifically, an amount of 15 vol % or less relative to the total amount of the glass ceramic composition of the inner layer part, and it is more preferably 13 vol % or less . Here, when the irregular alumina particles are used in addition to the flat alumina particles, the composition of the glass constituting the glass matrix of the inner layer part contains alumina components liquated from both the flat alumina particles and the irregular alumina particles.

Further, when ceramic particles other than the above to be a coloring material are contained in the first glass ceramic composition, a color other than white can be given to the inner layer part.

The coloring material is not limited in particular as long as it can color the inner layer part effectively and can keep the characteristics required for the above inner layer part, but is preferred to be a coloring inorganic pigment because the inner layer part is formed by firing at 800 to 900° C. for example. Examples of the coloring inorganic pigment are metal oxides, and particularly transition metal oxides, and for example, oxides of, such as Co, Ni, Fe, Mn, Sn, and Zr, specifically oxides having $Co_2O_3$, NiO, $Fe_2O_3$, MnO, and the like as components can be cited.

In the case of $Co_2O_3$, a blue color tone can be obtained, in the case of NiO, an ocher color tone can be obtained, in the case of $Fe_2O_3$, a red or coppery color tone can be obtained, and in the case of $MoO_3$, a milk white color tone can be obtained. Then, these coloring materials are combined, thereby making it possible to obtain inner layer parts having various color tones. Further, the coloring material may also be ones in which, for example, metals such as Ag and Au are made colloidal, in addition to the ones described above.

Particularly, as a black pigment, for example, a metal oxide pigment containing at least one metal selected from the group consisting of Cr, Co, Ni, Fe, Mn, and Cu, a combined metal oxide pigment of the above-described metal group, a titanium-based black pigment expressed by TiOx or TiOxNy, and the like can be cited. As the combined metal oxide pigment, specifically, for example, a Co—Fe—Cr based black pigment, a Cu—Cr—Mn based black pigment, a Mn—Bi based black pigment, a Mn—Y based black pigment, an Fe—Cr based black pigment, a Cr—Cu based pigment, and a Mn—Fe based pigment can be used, and they can be used solely, or they can be used by combining two or more of them.

The ratio of the coloring material in the inner layer part varies depending on the kind of coloring material, but is preferred to be 1 vol % or more in the first glass ceramic composition. By setting the ratio of the coloring material to 1 vol % or more, the inner layer part can be colored effectively. The ratio of the coloring material is preferably 2 vol % or more, and preferably 3 vol % or more. Further, when the ratio of the coloring material increases excessively, it becomes difficult to form the inner layer part satisfying the above characteristics and strength may decrease, so that the ratio of the coloring material is preferably 15 vol % or less, more preferably 13 vol % or less, and particularly preferably 10 vol % or less. Incidentally, when a plurality of coloring materials are used in combination, the total ratio of the coloring materials is preferred to be in the above range.

$D_{50}$ of the coloring material is preferred to be 2 to 20 µm. When $D_{50}$ is 2 µm or more, its dispersibility improves, so that even coloring can be obtained. Further, when $D_{50}$ is 20 µm or less, local coloring is suppressed to obtain even coloring. $D_{50}$ is more preferably 5 µm or more, and further preferably 8 µm or more. Further, $D_{50}$ is more preferably 15 µm or less, and further preferably 13 µm or less.

The content of the first glass powder in the first glass ceramic composition is a value resulted from subtracting the total amount of the flat alumina particles, the other ceramic particles, and the coloring inorganic pigment from 100. A preferred content is 47 to 70 vol %, and more preferably 50 to 60 vol %.

Next, there will be explained the second glass powder and the second glass ceramic composition constituting the surface layer part.

(Second Glass Powder)

The second glass powder softens during firing to form the second glass matrix. Whether or not crystal phases exist in the second glass matrix is not limited in particular as long as delamination between the surface layer part and the inner layer part is not caused. However, a glass in the second glass matrix is preferred not to be a crystallized glass, but to be amorphous.

As such glass powder, there is preferred borosilicate glass that contains, for example, 45 to 84% of $SiO_2$, 10 to 25% of $B_2O_3$, 0 to 10% of $Al_2O_3$, 0 to 30% of CaO, and 0 to 10% in total of at least one selected from the group consisting of $Na_2O$ and $K_2O$, in which the total content of $SiO_2$ and $Al_2O_3$ is 45 to 84%, which are expressed as mol % based on oxides.

$SiO_2$ becomes a network former of the glass, and is an essential component for increasing chemical durability, particularly acid resistance. When the content of $SiO_2$ is less than 45%, acid resistance may become insufficient. On the other hand, when the content of $SiO_2$ exceeds 84%, Ts and Tg may increase excessively.

$B_2O_3$ is a network former of the glass and an essential component. When the content of $B_2O_3$ is less than 10%, Ts may increase excessively, and further the glass may also become unstable. On the other hand, when the content of $B_2O_3$ exceeds 25%, it becomes difficult to obtain a stable glass, and further chemical durability may also decrease. The content of $B_2O_3$ is preferably 12% or more.

$Al_2O_3$ may also be added in a range of 10% or less for the purpose of increasing stability and chemical durability of the glass. When the content of $Al_2O_3$ exceeds 10%, there is a risk that glass is crystallized easily.

$Na_2O$ and $K_2O$ can be added in a range where their total content does not exceed 10% for the purpose of decreasing Ts and Tg. When the total content of $Na_2O$ and $K_2O$ exceeds 10%, chemical durability, particularly acid resistance may decrease, and electric insulating performance may also decrease. Further, when the total content of $Na_2O$ and $K_2O$ exceeds 10%, there is a risk that silver coloring occurs easily.

One or both of $Na_2O$ and $K_2O$ are contained preferably, and the total content of $Na_2O$ and $K_2O$ is preferably 0.9% or more.

When the total content of $SiO_2$ and $Al_2O_3$ is less than 45%, chemical durability may be insufficient. On the other hand, when the total content of $SiO_2$ and $Al_2O_3$ exceeds 84%, Ts and Tg may increase excessively.

Incidentally, the glass powder used for the surface layer part is not necessarily limited to ones made of only the above components, and can contain other components in a range that does not impair the object of the present invention. Other components are $Li_2O$, MgO, SrO, $TiO_2$, $ZrO_2$, and the like. Incidentally, in this embodiment, no lead oxide is contained. When such other components are contained, the total content of them is preferably 10% or less.

(Second Glass Ceramic Composition)

The second glass ceramic composition may be constituted of only the above second glass powder, but can contain the flat alumina particles that can be used for the first glass ceramic composition, and can also contain ceramic particles other than the above and a coloring inorganic pigment. Further, the thermal expansion coefficient of the surface layer part obtained from the second glass ceramic composition is preferably $10 \times 10^{-7}/K$ to $65 \times 10^{-7}/K$ for example, and is also preferably smaller than that of the inner layer part.

As a compounding amount of ceramic particles other than the flat alumina particles, 53 vol % or less can be contained in the second glass ceramic composition. When the compounding amount exceeds 53 vol %, fluidity of glass during firing decreases, and adherence to the inner layer part may become insufficient. It is preferably 50 vol % or less, and more preferably 45 vol % or less.

Further, when the surface layer part is colored in a color other than white, 1 to 15 vol % of a coloring inorganic pigment can be contained in the second glass ceramic composition similarly to the inner layer part.

As described above, the glass ceramic substrate of the present invention has a structure of the inner layer part being sandwiched between the surface layer parts basically. However, as long as a structure is applied in which the thickness of the inner layer part is sufficiently thick with respect to the thickness of the surface layer part, (which is equal to or more than about four times), warping of the substrate after firing is not caused and compressive stress can be added to the surface layer part even if the glass ceramic substrate is formed so as to have the surface layer part as one surface of one side thereof. Destruction of the glass ceramic substrate is caused mainly when tensile stress acts on a surface opposing the surface to which force is added. That is, when force is applied only to a surface of one side, the glass ceramic substrate may also be formed so as to have the surface layer part as one surface of one side thereof. That is, when the glass ceramic substrate is used for a portable electronic device housing or the like, the housing is formed so as to use a surface provided with the surface layer part as an inner surface of the housing, and thereby no problem is caused in terms of performance with respect to strength.

The thickness of the surface layer part is preferably 100 μm or less. At an interface between the surface layer part and the inner layer part, stress caused by the difference in thermal expansion coefficient acts. In the surface layer part, compressive stress acts, and this compressive stress becomes smaller as the distance from the interface becomes larger. When this distance exceeds 100 μm, the compressive stress hardly acts on the surface, and therefore the thickness of the surface layer part is preferably 100 μm or less.

The thermal expansion coefficient difference is preferably $10 \leq (\alpha_1 - \alpha_2)$ when the thermal expansion coefficient of the inner layer part is set to $\alpha_1 [10^{-7}/K]$ and the thermal expansion coefficient of the surface layer part is set to $\alpha_2 [10^{-7}/K]$. When $(\alpha_1 - \alpha_2)$ becomes smaller than 10, the compressive stress to be applied to the surface layer part hardly acts, so that $(\alpha_1 - \alpha_2)$ is preferably 10 or more.

(Manufacturing Method of the Green Sheet)

There are substantially no differences between a manufacturing method of the first green sheet for inner layer part and a manufacturing method of the second green sheet for surface layer part. Therefore, the first green sheet and the second green sheet will be explained below without distinction.

First, a binder and a plasticizer, a solvent, a dispersant, and/or the like as necessary are added to the glass ceramic composition to prepare a slurry. Note that in the slurry, all the components other than the glass ceramic composition are components that will be lost during firing.

As the binder, for example, polyvinyl butyral, acrylic resin, or the like can be used preferably. As the plasticizer, for example, dibutyl phthalate, di-2-ethylhexyl phthalate, dioctyl phthalate, butyl benzyl phthalate, or the like can be used. Further, as the solvent, an aromatic solvent such as toluene or xylene, an alcohol solvent such as 2-propanol or 2-butanol can be used. The aromatic solvent and the alcohol solvent are mixed and used preferably. Moreover, a dispersant can be used together.

Further, as compounding amounts of respective components in the slurry, 5 to 15 parts by mass of the binder, 1 to 5 parts by mass of the plasticizer, 2 to 6 parts by mass of the dispersant, and 50 to 90 parts by mass of the solvent relative to 100 parts by mass of the glass ceramic composition are preferred.

Preparation of the slurry is by, for example, adding the glass ceramic composition to a mixed solvent obtained by mixing the solvent with a dispersant as necessary, and stirring them by a ball mill using $ZrO_2$ as a medium. A vehicle obtained by dissolving a binder in a solvent is added thereto, which is stirred with a stirrer having a propeller and thereafter filtered using a mesh filter. At this time, bubbles confined inside can be removed by stirring while vacuuming.

Next, the obtained slurry is formed in a sheet shape by applying it on a PET film, on which a release agent is applied, by using a doctor blade for example, and dried to thereby manufacture a green sheet. Incidentally, the method of forming the green sheet from the slurry may be a roll forming method. In any method, during formation of the above green sheet, the flat alumina particles are oriented in a direction in which their individual thickness directions are substantially perpendicular to a surface direction of the green sheet.

For example, in the case of application by a doctor blade method, the slurry passes through a gap formed by a tip of blade part of a doctor blade apparatus and a surface of the PET film, and thus the flow (flow line) of the slurry is along a carrying direction of the PET film. At this time, the flat alumina particles dispersed in the slurry also pass through the above-described gap along the flow of the slurry. Accordingly, the flat alumina particles in the green sheet are oriented so that their flat surface directions are substantially parallel with the surface direction of the green sheet. Note that when the flat surfaces have, for example, a long length direction and a short length direction like a rectangle does, long length directions, that is, major axis directions of the flat alumina particles become substantially parallel with a formation direction of the doctor blade method.

Note that formation of the green sheet is normally performed with a flow in a certain direction in any method, and thus orientation of the flat alumina particles in the green sheet is generated by any other method than the doctor blade method, such as a roll forming method. In the present invention, the doctor blade method is preferred in that it can stably obtain a green sheet in which the flat alumina particles are oriented in the same direction at high ratio.

(Manufacturing Method of the Paste)

First, the second glass ceramic composition and a resin component are compounded by a mass ratio of 60:40 to be kneaded for one hour in a porcelain mortar, and further dispersion of the kneaded product is performed three times by three rolls, and a paste for surface layer part is produced. Incidentally, as the resin component, one obtained by mixing, for example, ethyl cellulose and a terpineol by a mass ratio of 85:15 and dispersing the mixture may be used.

(Method of Layering the First Green Sheet and the Second Green Sheet)

The single first green sheet may be used as a single layer, or the plural first green sheets may also be used. When the plural first green sheets are layered, preferably, respective green sheets are layered so that the formation directions by the doctor blade method, the roll forming method, or the like match, so as to provide higher strength to the obtained glass ceramic substrate. However, in this case, as long as strength of a certain degree or more can be obtained in the obtained glass ceramic substrate, the first green sheets may be layered as necessary so that their formation directions are orthogonal alternately. When the plural first green sheets are layered, they are integrated by thermocompression bonding.

Next, when the second green sheet is used to form the surface layer part, the second green sheet is layered on the upper and lower surfaces of the first green sheet, and the first green sheet and the second green sheets are integrated by thermocompression bonding to form a green sheet for substrate.

When the paste is used to form the surface layer part, the paste is applied on one surface of the first green sheet by using a screen printer for example to be dried. Next, the first green sheet is inverted, and the paste is applied on the other surface thereof by using a screen printer for example to be dried, and a green sheet for substrate is formed.

(Firing Method)

Thereafter, degreasing for decomposing and removing the components other than the glass ceramic compositions such as the binder in the green sheet for substrate is performed, and subsequently firing is performed and the glass ceramic compositions are sintered to obtain the glass ceramic substrate.

The degreasing is performed by, for example, retaining at a temperature of 500 to 600° C. for 1 to 10 hours. When the degreasing temperature is lower than 500° C. or the degreasing time is shorter than one hour, there is a risk that the binder and so on cannot be decomposed and removed sufficiently. When the degreasing temperature is set to about 600° C. and the degreasing time is set to about 10 hours, the binder and so on can be removed sufficiently, but exceeding this time length may conversely decrease productivity, and the like.

The firing temperature is adjusted corresponding to Ts of the first and second glass powders and the crystallization temperature of the glass constituting the first and second glass matrices. Normally, such a temperature equal to or lower than the crystallization temperature of the glass of the first and second glass matrices and higher than Ts of the first and second glass powders by 0 to 200° C., preferably Ts+50° C. to Ts+150° C., is set to the firing temperature.

For example, when the above glass composition of the first glass powder with the crystallinity of 25% or less is used, a temperature of 800 to 900° C. can be set to the firing temperature, and a firing temperature of 830 to 880° C. is particularly preferred. The firing time can be adjusted to about 20 to 60 minutes. When the firing temperature is lower than 800° C. or the firing time is shorter than 20 minutes, there is a risk that a fine sintered compact cannot be obtained. When the firing temperature is set to about 900° C. and the firing time is set to about 60 minutes, a sufficiently fine one can be obtained, but when it exceeds these temperature and time, productivity and the like may decrease conversely.

Upon operating such firing, only the first glass powder melts in the first green sheet, and the molten glass fills gaps among the flat alumina particles. At this time, the vicinity of a surface of a flat alumina particle liquates from an interface with the molten glass and diffuses into the glass components. By the alumina diffusing into the molten glass, the softening point of the glass lowers, fluidity of the flat alumina particles increases, and the sintering proceeds while rearrangement of the flat alumina particles is facilitated. At this time, a firing shrinkage ratio in the surface direction of the green sheet is preferably not less than 6% nor more than 20%. When the shrinkage ratio in the surface direction is less than 6%, rearrangement of particles has not proceeded, and warping of the glass ceramic substrate may occur. When it exceeds 20%, fluidity of the glass is high, the dispersion occurs in the existence ratio of the flat alumina particles in the glass ceramic substrate, and the strength may also disperse. When the firing shrinkage ratio in the surface direction is not less than 6% nor more than 20%, the shrinkage ratio in the thickness direction becomes about 10% to 30%.

Further, the flat alumina particles shrink in size in its entirety while substantially keeping its aspect ratio during firing. Further, during firing, the green sheet for substrate shrinks in dimensions in thickness direction and vertical and horizontal direction, but the state that the flat alumina particles are oriented substantially parallel with the surface direction of the first green sheet is maintained. Therefore, the obtained glass ceramic substrate has a structure in which the flat alumina particles whose major axis directions are oriented substantially parallel with the surface direction constituting the main surface when it is the green sheet for substrate are dispersed in the first glass matrix, and has sufficient strength.

Further, the surface layer part formed after firing has a thermal expansion coefficient smaller than that of the inner layer part, so that compressive stress occurs in the surface layer part in a cooling process after firing.

Thus, the strength of the glass ceramic substrate of the present invention can be further improved more than the strength to be obtained in the inner layer part alone, and can be increased to, for example, 500 MPa or more as three-point bending strength. As long as the strength to be obtained in the inner layer part alone is 600 MPa or more, the strength of the glass ceramic substrate of, for example, 700 MPa or more can also be achieved.

The open porosity of the glass ceramic substrate of the present invention is preferably 5% or less. The open porosity of the glass ceramic substrate is more preferably 3% or less, furthermore preferably 1% or less, and particularly preferably 0%. By having the open porosity of the glass ceramic substrate in the above ranges, strength of the glass ceramic substrate can be increased to a sufficiently high level. Further, when pores exist in the glass ceramic substrate, plating liquid easily enters the pores in a plating step, which can cause change of color. Therefore, by having the open porosity of the glass ceramic substrate in the above ranges, reliability with respect to change of color can be increased while securing strength.

Note that when ones that can suppress the crystallinity to 25% or less are used as the glass powder, a stable firing state can be ensured, and a dispersion in strength due to separation of crystals and delamination between the surface layer part and the inner layer part can be suppressed.

Hereinafter, there will be explained a state of a cross section of the glass ceramic substrate of the present invention. Incidentally, as the above cross section, a cross section that is taken along the thickness direction, and is taken along a direction substantially parallel with the formation direction of the green sheet is preferred.

[Cross Section of the Glass Ceramic Substrate]

When the glass ceramic substrate is taken along one of cross sections along the thickness directions of the flat alumina particles, the ratio occupied by the cross section of the flat alumina particles relative to the total cross-sectional area of the inner layer part is preferably 20% or more. Incidentally, in this description, the "thickness" of a cross-sectional shape of a flat alumina particle appearing in the cross section of the inner layer part is equivalent to the thickness of the flat alumina particle since the cross section of the inner layer part is a cross section along the thickness direction of the flat alumina particle. On the other hand, the "maximum diameter" of the cross-sectional shape of a flat alumina particle appearing in the cross section of the inner layer part denotes a maximum diameter of a flat alumina particle cross section in this cross section, and does not necessarily match the major axis of the flat alumina particle itself. The "maximum diameter" of the cross-sectional shape of a flat alumina particle appearing in the cross section of the inner layer part will also be hereinafter referred to as a "cross-sectional maximum diameter" as necessary. Moreover, the "aspect ratio" refers to a value resulted from dividing this cross-sectional maximum diameter by the thickness, and will also be hereinafter referred to as a "cross-sectional aspect ratio" as necessary.

In one of cross sections of the inner layer part taken along the thickness directions of flat alumina particles, it is only necessary to satisfy the above prescribed structure of the cross section of the flat alumina particle, and it is not always necessary to satisfy the above prescribed structure in all the cross sections taken along the thickness directions of the flat alumina particles. This is because when at least a certain cross section satisfies the above prescription, the inner layer part has sufficient strength.

The glass ceramic substrate of the present invention will be explained below with reference to the drawings.

Figure 1:
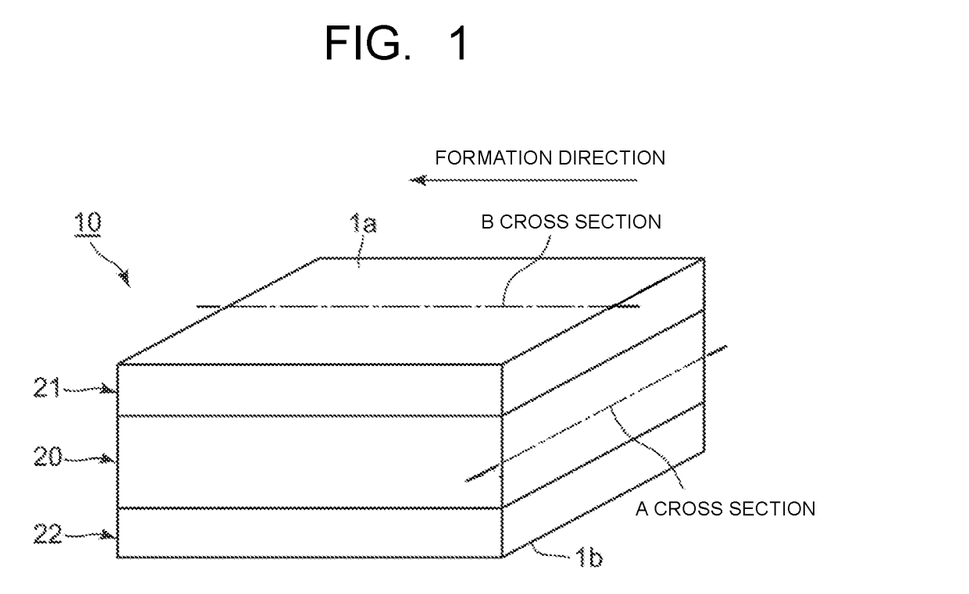
FIG. 1 is an exterior view illustrating one embodiment of a glass ceramic substrate of the present invention.

FIG. 1 is an exterior view illustrating one embodiment of the glass ceramic substrate of the present invention. The glass ceramic substrate illustrated in FIG. 1 is one constituted of an inner layer part 20 with flat alumina particles (not illustrated) dispersed in a glass matrix (not illustrated) and surface layer parts 21 and 22 sandwiching the inner layer part 20 and formed in a plate shape. The "formation direction" illustrated in FIG. 1 is, for example, the formation direction of the doctor blade method when the glass ceramic substrate is obtained by firing a green sheet formed by the doctor blade method. The same is true for the formation direction of the glass ceramic body obtained when the green sheet is formed by a different forming method.

Figure 2:
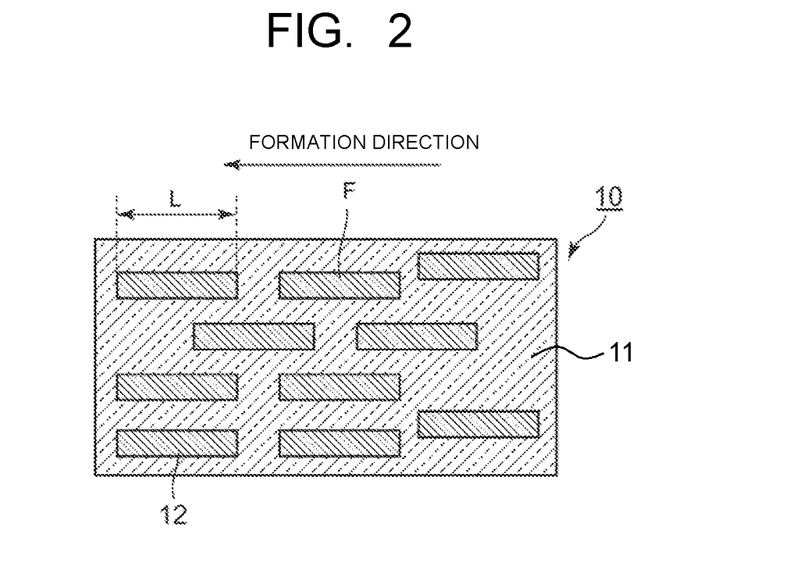
FIG. 2 is a schematic cross-sectional view in an A cross section of the glass ceramic substrate illustrated in FIG. 1.

FIG. 2 is a schematic cross-sectional view of (an A cross section), where the inner layer part is taken along at an A position along a surface parallel with main surfaces 1a and 1b of the glass ceramic substrate 10 illustrated in FIG. 1. That is, FIG. 2 schematically illustrates a state that, in a glass matrix 11, flat (schematically represented as a rectangular plate) alumina particles 12 are oriented with their major axis (denoted by "L" in FIG. 2) directions match the above formation direction.

Figure 3:
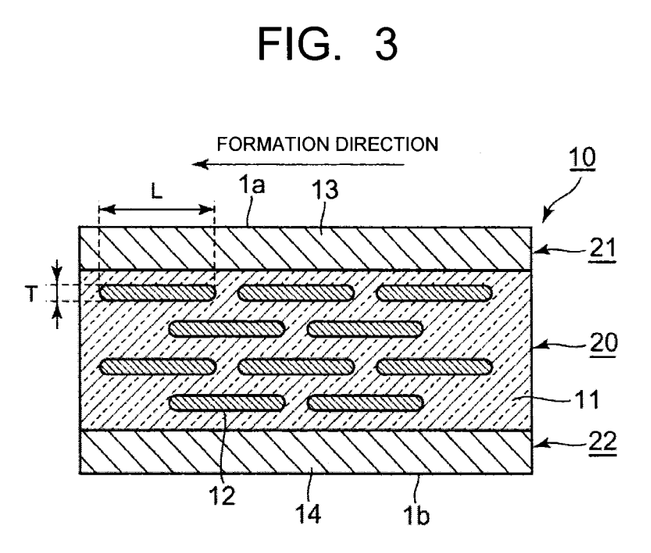
FIG. 3 is a schematic cross-sectional view in a B cross section of the glass ceramic substrate illustrated in FIG. 1.

FIG. 3 is a schematic cross-sectional view of (a B cross section), where the glass ceramic substrate 10 in a relation of perpendicular direction with the cross section of FIG. 2 is taken along a B position. It is a view schematically illustrating a cross section that is along a thickness (denoted by "T" in FIG. 3) direction of the flat alumina particles 12 in the inner layer part 20 illustrated in FIG. 1, and that is along the major axis (L) direction of the flat alumina particles 12, that is, the above formation direction.

The flat alumina particles 12 in the glass ceramic substrate 10 illustrated in FIG. 2 and FIG. 3 are dispersed in the glass matrix 11 in a direction in which the individual thickness (T) directions are substantially perpendicular to the surface direction of the main surfaces 1a and 1b. In other words, as illustrated in FIG. 2, the flat alumina particles 12 are dispersed so that flat surfaces (F) of respective particles are parallel with the main surfaces 1a and 1b of the glass ceramic substrate 10. Note that the thickness (T) direction of the flat alumina particle 12 is, for example, an up and down direction in the view in the case illustrated in FIG. 3, and a flat direction (that is, length direction) is a direction perpendicular to this thickness direction (left and right direction in FIG. 3).

The glass matrix 11 is not particularly limited as long as the crystallinity of glass is 25% or less, but one in which the crystallinity of glass is 20% or less is preferred, and 15% or less is more preferred. As the glass constituting the glass matrix 11, one that is not crystallized after firing, that is, amorphous one is the most preferred.

In the glass ceramic substrate of the present invention, when the B cross section is observed with a stereoscopic microscope, it is possible to confirm that the flat alumina particles 12 are dispersed in the glass matrix 11 as illustrated in FIG. 3. Further, as described above, the B cross section illustrated in FIG. 3 is a cross section substantially parallel with the major axis direction of the flat alumina particles 12, and the major axis (L) of the flat alumina particles 12 can be confirmed in this cross section. Therefore, in the cross section illustrated in FIG. 3, of the flat alumina particles 12, the cross-sectional maximum diameter corresponds to the major axis, and the cross-sectional aspect ratio corresponds to the aspect ratio.

The B cross section along the thickness direction of the glass ceramic substrate 10 illustrated in FIG. 3 matches the cross section along the thickness direction of the flat alumina particles 12. The flat alumina particles 12 having a cross section with an aspect ratio of 3 or more to be exposed to the cross section along the thickness direction of the glass ceramic substrate 10 are referred to as "flat alumina particles with the prescribed cross section" in particular.

By containing the flat alumina particles with the prescribed cross section in the inner layer part 20, a direction in which a destruction crack proceeds can be deflected to disperse stress, so that it becomes possible to increase destruction strength. By increasing the destruction strength of the inner layer part 20 in which tensile stress acts in particular, destruction strength of the glass ceramic substrate 10 can be increased.

However, when destruction strength of the flat alumina particles 12 is low at this time, there is a risk that flat alumina particles are destructed by stress applied externally, to thereby cause a crack to proceed, and strong destruction strength cannot be given. In the B cross section, as the flat alumina particles with the prescribed cross section, ones that meet the conditions of having a cross section with a thickness of 0.2 μm or more, a cross-sectional maximum diameter of 8 μm or less, and a cross-sectional aspect ratio of 3 to 18 are preferred. In such flat alumina particles with the prescribed cross section, by having a thickness of 0.2 μm or more, strength of the flat alumina particles 12 themselves is sufficient, and strength of the glass ceramic substrate can be maintained to a sufficiently high level. Further, by having the cross-sectional maximum diameter of 8 μm or less, even dispersion into the glass matrix 11 can be achieved. Regarding the cross-sectional aspect ratio, when it is 3 or more, extension of stress that is given externally by destruction or the like is deflected and strength of the glass ceramic substrate 10 can be raised to a sufficiently high level, and when it is 18 or less, even dispersion into the glass matrix can be achieved during manufacturing.

Incidentally, of the inner layer part, in a cross section that has an area occupancy ratio of the flat alumina particles with the prescribed cross section is 20% or more, of the flat alumina particles with the prescribed cross section, preferably, the mean thickness is 0.25 μm or more, the mean cross-sectional maximum diameter is 5 μm or less, and the mean cross-sectional aspect ratio is 3 to 18.

Further, by that the area occupancy ratio of the flat alumina particles with the prescribed cross section is 20% or more, strength of the glass ceramic substrate is at a sufficiently high level. Incidentally, when the area occupancy ratio of the flat alumina particles with the prescribed cross section is too high, due to decrease in sinterability of the glass ceramic substrate 10, voids occur in the inner layer part 20 and strength may decrease. The area occupancy ratio is preferably 45% or less. An open porosity can be presented as an index for the sinterability of the glass ceramic substrate 10.

Here, the area occupancy ratio(%) of the flat alumina particles 12 with the prescribed cross section can be calculated by measuring the thicknesses and the cross-sectional maximum diameters of the individual flat alumina particles 12 in 100 μm$^2$ of a measurement cross section by using a scanning microscope (SEM) and an image analysis apparatus, obtaining the sum (μm$^2$) of cross-sectional areas of the flat alumina particles 12 with the prescribed cross section, dividing it by 100 μm$^2$, and further multiplying it by 100.

In the schematic cross-sectional view illustrated in FIG. 3, the cross sections of all the flat alumina particles 12 satisfy the conditions of the prescribed cross section, but all the flat alumina particles existing in the B cross section need not always be the flat alumina particles with the prescribed cross section, and it will suffice when the area occupancy ratio of the flat alumina particles with the prescribed cross section in the inner layer part is 20% or more.

Incidentally, in the B cross section, cross-sectional areas of the flat alumina particles 12 out of the range of the prescribed cross section can be set as a total cross-sectional area combined with cross-sectional areas of other ceramic particles that may be contained arbitrarily. The ratio of the total cross-sectional area to the entire cross-sectional area of the glass ceramic substrate is preferably 25% or less, more preferably 20% or less, and particularly preferably 15% or less.

Further, although it will suffice that the above prescription is achieved in one of cross sections along the thickness directions of the flat alumina particles, a glass ceramic substrate is preferred in which the area occupancy ratio of the flat alumina particles with the prescribed cross section is measured and calculated for each of arbitrary plural cross sections, for example, 10 to 20 cross sections along the thickness directions of the flat alumina particles, and an average thereof is 20% or more. For example, in the glass ceramic substrate 10 illustrated in FIG. 1 to FIG. 3, as the arbitrary 10 to 20 cross sections along the thickness directions of the flat alumina particles, cross sections taken along a flat surface that is along the thickness directions of the flat alumina particles 12 as illustrated in FIG. 3 and parallel with the major axis of the flat alumina particles 12 are normally selected.

Note that also when the area occupancy ratio of the flat alumina particles with the prescribed cross section is thus measured and calculated in plural cross sections, the mean thickness, the mean cross-sectional maximum diameter, and the mean cross-sectional aspect ratio of the flat alumina particles are preferred to be in the above ranges.

Note that as described above, strength of the glass ceramic substrate is preferably greater than 500 MPa, more preferably 530 MPa or more, and particularly preferably 550 MPa or more as three-point bending strength, for example. Such strength can be achieved sufficiently when the structure of the glass ceramic substrate 10 is the above structure.

Here, the glass ceramic substrate may contain ceramic particles other than the flat alumina particles depending on an application of the obtained glass ceramic substrate within the range that does not impair effects of the present invention. Specifically, examples include irregular alumina particles and ceramic particles such as silica, zirconia, titania, magnesia, mullite, aluminum nitride, silicon nitride, silicon carbide, forsterite, and cordierite, for which a shape such as flat or irregular is of no object in particular. Among others, use of zirconia particles is preferred when high reflectivity is required as in the above substrate for mounting a light emitting element.

As a compounding amount of ceramic particles other than the flat alumina particles in the glass ceramic substrate, an amount that does not impair effects of the present invention can be contained. Specifically, in the B cross section illustrated in FIG. 3, the total cross-sectional area with the cross-sectional areas of the flat alumina particles out of the range of the prescribed cross section relative to the entire area of this cross section only needs to be 25% or less, and is more preferably 20% or less, and particularly preferably 15% or less.

The glass ceramic substrate of the present invention has been explained with examples above, but the structure thereof can be changed appropriately and as necessary within a limit that does not go against the gist of the present invention.

EXAMPLES

Hereinafter, a specific explanation will be given with reference to examples.

Example: Examples 1 to 9 and 13, Comparative Example: Examples 10, 11 and 12

(Manufacturing Glass Powders)

Respective glass materials were compounded and mixed to have a raw material mixture for making a glass of a ratio (in mole percentage based on oxides) presented in Table 2, this raw material mixture was put in a platinum crucible, melted for 60 minutes at 1200 to 1500° C., and thereafter the molten product was poured out and cooled. Then, the cooled product was pulverized for 10 to 60 hours by an alumina ball mill with water being a solvent and classified, thereby obtaining glass powders G1 to G4 of respective compositions.

TABLE 2

| Glass composition | | G1 | G2 | G3 | G4 |
|---|---|---|---|---|---|
| Glass composition (mol %) | $SiO_2$ | 47.9 | 45.5 | 60.4 | 81.6 |
| | $B_2O_3$ | 15.6 | 16.8 | 15.6 | 16.6 |
| | CaO | 27.5 | 28.7 | 15.0 | 0.0 |
| | $Al_2O_3$ | 6.0 | 0.1 | 6.0 | 0.0 |
| | SrO | 0.0 | 6.0 | 0.0 | 0.0 |
| | $Na_2O$ | 2.0 | 1.0 | 2.0 | 0.0 |
| | $K_2O$ | 1.0 | 1.9 | 1.0 | 1.8 |
| Thermal expansion coefficient $\alpha$ ($10^{-7}$/K) | | 69 | 88 | 58 | 28 |

(Manufacturing Flat Alumina Particles and Irregular Alumina Particles)

Flat boehmite particles were manufactured by hydrothermal synthesis from aluminum hydroxide, and the flat boehmite particles were fired to obtain flat alumina particles. Similarly, irregular boehmite particles were fired to obtain irregular alumina particles.

First, the flat boehmite particles, aluminum hydroxide, sodium hydroxide or calcium carbonate as a pH adjuster, and water were charged in an autoclave. Here, pH was adjusted to 8 or more, and the compounding ratio of water was 5 times or more of the amount of aluminum hydroxide by mass ratio. Then, they were brought into reaction for 2 to 10 hours at 150 to 200° C. under natural pressure. Thereafter, washing with water and filtering were performed, obtaining respective flat boehmite particles Note that adjustment of sizes of the flat alumina particles was performed by adjusting sizes during manufacturing of the flat boehmite particles.

Thereafter, the obtained flat boehmite particles were fired at 1200 to 1400° C., to thereby obtain flat alumina particles having a mean aspect ratio of 3 or more. Note that measurement of sizes of the flat alumina particles refers to one calculated by averaging values resulted from measuring lengths of 100 flat alumina particles by using a scanning electron microscope (SEM).

(Manufacturing Glass Ceramic Substrates)

Next, as presented in Table 3, glass powders and as ceramic particles, flat alumina particles, zirconia particles, silica particles, and alumina particles were compounded by a predetermined ratio (vol%) and mixed to obtain glass ceramic compositions A to G. Note that as the zirconia particles, $D_{50}$ is 0.5 µm and a specific surface area is 8.0 $m^2$/g. As the silica particles, $D_{50}$ is 3.4 µm and a specific surface area is 3.4 $m^2$/g. As the alumina particles, a alumina particles having $D_{50}$ of 0.8 µm and a specific surface area of 6.5 $m^2$/g were used.

From the glass ceramic compositions A to G obtained as above, green sheets were manufactured. To glass ceramic composition 50 g, an organic solvent (mixture of toluene, xylene, 2-propanol, and 2-butanol by a mass ratio of 4:2:2:1) 15 g, a plasticizer (di-2-ethylhexyl phthalate) 2.5 g, polyvinyl butyral 5 g as a binder, and a dispersant 0.5 g were compounded and mixed, thereby making a slurry. This slurry was applied and dried by the doctor blade method on the PET film. The gap of the doctor blade was adjusted so that a sheet used for an inner layer part obtains a thickness of 150 µm after firing and a sheet used for a surface layer part obtains a thickness presented in Table 4 after firing, and green sheets were manufactured. The obtained green sheets were cut into 40 mm squares (40 mm vertical, 40 mm horizontal) to obtain green sheets for evaluation.

For the glass ceramic compositions B and D, a glass ceramic paste was also manufactured. A glass ceramic composition and a resin component were compounded by a mass ratio of 60:40 to be kneaded for one hour in a porcelain mortar, and further dispersion of the kneaded product was performed three times by three rolls, and a glass ceramic paste was prepared. Here, as the resin component, one obtained by mixing ethyl cellulose and a terpineol by a mass ratio of 85:15 and dispersing the mixture was used.

TABLE 3

| | | | A | B | C | D | E | F | G |
|---|---|---|---|---|---|---|---|---|---|
| Glass ceramic composition | Flat alumina particles (α alumina) | Mean thickness (µm) | 0.8 | 0.8 | 0.8 | — | — | 2 | 0.8 |
| | | Mean major axis (µm) | 4 | 4 | 4 | — | — | 3 | 4 |
| | | Mean aspect ratio | 5 | 5 | 5 | — | — | 1.5 | 5 |
| | | Content (vol %) | 38 | 50 | 35 | 0 | 0 | 35 | 43 |
| | Glass | Composition | G1 | G2 | G3 | G4 | G4 | G4 | G1 |
| | | Content (vol %) | 55 | 50 | 65 | 100 | 75 | 50 | 52 |

TABLE 3-continued

|  |  |  | A | B |  |  | C | D | E | F | G |
|---|---|---|---|---|---|---|---|---|---|---|---|
|  | Zirconia particles content (vol %) |  | 7 | — |  |  | — | — | — | 15 | 4 |
|  | Silica particles content (vol %) |  | — | — |  |  | — | — | 25 | — | — |
|  | Alumina particles content (vol %) |  | — | — |  |  | — | — | — | — | 1 |
| Cross-sectional observation | Flat alumina particles (α alumina) | Mean thickness(μm) | 0.8 | 0.8 |  |  | 0.8 | — | — | 1.8 | 0.8 |
|  |  | Mean maximum diameter(μm) | 4 | 4 |  |  | 4 | — | — | 2.7 | 4 |
|  |  | Area ratio (%) | 30 | 40 |  |  | 32 | — | — | 32 | 35 |
| Firing temperature (° C.) |  |  | 860 | 860 | 820 | 840 | 880 | 900 | 860 | 860 | 860 | 860 | 860 |
| Three-point bending strength (MPa) |  |  | 480 | 470 | 510 | 509 | 404 | 365 | 394 | 70 | 80 | 270 | 650 |
| Thermal expansion coefficient α(10⁻⁷/K) |  |  | 68 | 83 | 83 | 83 | 83 | 83 | 65 | 28 | 41 | 64 | 68 |

Next, as presented in Table 4, a glass ceramic substrate having an inner layer part and surface layer parts was manufactured. The case of the surface layer part being formed of the green sheet and the case of the surface layer part being formed of the paste will be explained below.

The case of the surface layer part being formed of the green sheet is explained. In order for the inner layer part to obtain a thickness of 600 μm after firing, four green sheets each having 150 μm after firing are overlaid with their formation directions being aligned in the same direction to obtain a green sheet for inner layer part. Next, on both surfaces of the green sheet for inner layer part, each single green sheet for surface layer part was layered so that its formation direction was aligned in the same direction as the formation direction of the green sheet for inner layer part to be integrated with pressure of 10 MPa applied thereto at 80° C., and then a green sheet for substrate was manufactured. In order for the inner layer part to have a thickness of 1000 μm after firing, two kinds of green sheets having different thicknesses of 100 μm and 150 μm after firing are overlaid with their formation directions being aligned in the same direction to obtain a green sheet for inner layer part. Even when any number of each of the two kinds of green sheets different in thickness is selected, substantially the same characteristics can be obtained as long as the thickness becomes the same. When the thickness is set to 1000 μm, for example, a combination of a single green sheet having a thickness of 100 μm and six green sheets each having a thickness of 150 μm, a combination of four green sheets each having a thickness of 100 μm and four green sheets each having a thickness of 150 μm, and the like can be cited. Incidentally, in the above, the green sheets were layered so that formation directions of the green sheets were aligned in the same direction, but a layering direction is not limited to this, and the green sheets may also be layered so that their formation directions are orthogonal in each layer. They are layered so as to be orthogonal, thereby suppressing a dispersion in shrinkage during firing.

In the case of the surface layer part being formed of the paste, one surface of a green sheet for inner layer part that was obtained in the same method as the above, the paste was applied and dried, and next on the other surface thereof, the paste was applied and dried, and thereby a green sheet for substrate was manufactured.

The green sheet for substrate obtained in this method was retained for five hours at 550° C. in a firing furnace, and thereby components other than the glass ceramic compositions such as a binder were decomposed and removed, and thereafter firing was performed by retaining for one hour at a firing temperature presented in Table 4. In this method, glass ceramic substrates presented in Examples 1 to 13 were obtained.

TABLE 4

|  | Example | 1 | 2 | 3 | 4 | 5 | 6 | 7 | 8 | 9 | 10 | 11 | 12 | 13 |
|---|---|---|---|---|---|---|---|---|---|---|---|---|---|---|
| Inner layer part | Composition | A | A | A | A | B | B | B | B | B | B | C | F | G |
|  | Thickness (μm) | 600 | 600 | 600 | 600 | 600 | 600 | 600 | 600 | 600 | 600 | 600 | 600 | 1000 |
|  | Crystallinity (%) | — | — | — | — | — | — | — | 13 | 20 | 40 | — | — | — |
|  | Mean aspect ratio of flat alumina particles by cross-sectional observation | 5 | 5 | 5 | 5 | 5 | 5 | 5 | 5 | 5 | 5 | 5 | 1.5 | 5 |
| Surface layer part | Composition | D | D | D | E | C | C | C | C | C | C | B | B | D |
|  | Thickness (μm) | 10 | 20 | 32 | 30 | 95 | 30 | 30 | 30 | 30 | 30 | 45 | 20 | 10 |
|  | Form | Paste | Paste | Sheet | Sheet | Sheet | Sheet | Sheet | Sheet | Sheet | Sheet | Sheet | Paste | Sheet |
| Firing temperature (° C.) |  | 860 | 860 | 860 | 860 | 860 | 820 | 840 | 860 | 880 | 900 | 860 | 860 | 860 |
| Three-point bending strength (MPa) |  | 630 | 620 | 560 | 550 | 518 | 580 | 573 | 552 | 500 | 432 | 470 | 350 | 750 |
| Thermal expansion coefficient difference $\alpha_d(10^{-7}/K)$ |  | 40 | 40 | 40 | 27 | 18 | 18 | 18 | 18 | 18 | 18 | −18 | 36 | 40 |
| Crystallinity (%) |  | — | — | — | — | — | — | — | 12 | 18 | 38 | — | — | — |
| Presence or absence of delamination |  | Abs | Abs | Abs | Abs | Abs | Abs | Abs | Abs | Abs | Abs | Abs | Abs | Abs |
| Substrate color |  | Wht | Wht | Wht | Wht | Wht | Wht | Wht | Wht | Wht | Wht | Wht | Wht | Wht |

In the table "Abs" means absence and "Wht" means white.

(Evaluation)

The glass ceramic substrates obtained in Examples 1 to 13 above were each evaluated as follows. Results are presented in lower sections of Table 4.

<Crystallinity>

Of each of the glass ceramic substrates, crystallinity of glass matrix was examined by X-ray diffraction using a CuKα ray as a characteristic X ray. Regarding measurement of the inner layer part, the surface layer part of the glass ceramic substrate was polished to thereby be removed, and thereafter a powdered sample was measured. As a result, in Examples 8 to 10, crystals were separated. A method of calculating crystallinity from X-ray diffraction is described below.

A peak A (equivalent to I(glass)) corresponding to anorthite ($CaAl_2Si_2O_8$) appeared at a diffraction angle $2\theta=28.0$ to 28.1 deg., and a peak B (equivalent to $I(Al_2O_3)$) corresponding to [104] of alumina ($Al_2O_3$) appeared at a diffraction angle $2\theta=35.1$ to 35.3 deg.

The crystallinity was calculated by the above formula (1) by using the measurement results of the above X-ray diffraction, that is, the intensity of peak A and the intensity of peak B. In the case of Example 8, I(glass)=intensity of peak A was 52 and $I(Al_2O_3)$=intensity of peak B was 349. That is, from crystallinity (%)=(52 / (349+52))×100, 13% was calculated. Calculation was performed similarly, 20% was calculated in Example 9 and 40% was calculated in Example 10.

In all the other examples, no peak of crystallized glass was detected by the X-ray diffraction. Results of the examples having no crystallization are presented as "–" in Table 4.

<Cross-Sectional Observation of Flat/Irregular Alumina Particles>

The respective glass ceramic substrates obtained in Examples 1 to 13 were cut in the thickness direction and a direction substantially parallel with the formation direction of the doctor blade, and cross sections thereof were mirror polished. Ten different points in cross sections of the inner layer parts were observed using a scanning electron microscope (SEM), and cross-sectional maximum diameters and thicknesses of the obtained images were measured individually regarding all alumina particles in a cross section 100 $\mu m^2$ using image analysis software (Winroof, made by Mitani Corporation), to thereby obtain cross-sectional aspect ratios. Among them, flat alumina particles with the prescribed cross section having a cross-sectional aspect ratio of 3 or more were chosen, and a mean value thereof was obtained. The mean aspect ratios of the flat alumina particles with the prescribed cross section are presented in Table 4. Further, areas of the flat alumina particles with the prescribed cross section in the same cross section were measured individually to obtain a total area ($\mu m^2$) thereof. This was divided by the total cross sectional area 100 $\mu m^2$, and further multiplied by 100, to thereby obtain the area ratio by percentage occupied by the flat alumina particles with the prescribed cross section in the entire area of the cross section. Results of the area ratio occupied by the flat alumina particles with the prescribed cross section are presented in Table 3. Incidentally, regarding ones having the flat alumina particles among Examples 1 to 13, the mean aspect ratio of the flat alumina particles in the above cross section of the inner layer part is at least 3 or more regardless of whether or not the flat alumina particles with the prescribed cross section are chosen.

<Three-Point Bending Strength>

Regarding the respective glass ceramic substrates obtained in Examples 1 to 13, a three-point bending strength test complying with JIS C2141 was performed. Specifically, one side of a glass ceramic substrate was supported by two points, a weight was applied gradually to a middle position of the two points on a side opposing the side, a load when the glass ceramic substrate was broken was measured, and the three-point bending strength (MPa) was calculated based on this. This bending strength was measured at 30 points to obtain a mean value (mean bending strength). Results are presented in Table 4.

<Thermal Expansion Coefficient Measurement>

Regarding fired bodies of the respective glasses G1 to G4 and the glass ceramic compositions represented by A to G, a thermal expansion coefficient complying with JIS R-3102 was measured. That is, a fired body was set in a thermal analysis apparatus (TMA), temperature was increased at 10° C./minute, and its length was recorded. In a temperature range of 50° C. to 400° C., a mean thermal expansion coefficient was calculated from its initial length and expanded length. Results of the mean thermal expansion coefficient are presented in Table 2 and Table 3. Further, from these results of the mean thermal expansion coefficient, the thermal expansion coefficient difference between the inner layer part and the surface layer part was obtained by calculation. These results of the thermal expansion coefficient difference ("$\alpha_d$" in Table 4) between the inner layer part and the surface layer part are presented in Table 4.

As is clear from Table 4, the glass ceramic substrates of the present invention obtained in Examples 1 to 9, and 13 achieved high strength of greater than 500 MPa in terms of the three-point bending strength. Particularly, the glass ceramic substrate of the present invention obtained in Example 13 achieved high strength of greater than 700 MPa. The glass ceramic substrates in Example 12 where the requirement of the aspect ratio by cross-sectional observation of the flat alumina particles is not satisfied and in Example 11 where the thermal expansion coefficient of the surface layer part is larger than that of an inner layer part both have a three-point bending strength of 480 MPa or less and thus do not have sufficient strength.

According to the present invention, a glass ceramic substrate that has a sufficiently high strength and has a high degree of flexibility in shape that can correspond to a three-dimensional shape, and a layered body having this glass ceramic substrate can be provided, which are expected to be used as a wiring board used for various electronic devices and as a housing for electronic device such as a portable phone.

What is claimed is:

1. A glass ceramic substrate, comprising:
    an inner layer part having a first thermal expansion coefficient; and
    a surface layer part having a second thermal expansion coefficient smaller than the first thermal expansion coefficient,
    wherein a crystallinity of the glass ceramic substrate is 25% or less,
    the inner layer part contains a first glass matrix having a crystallinity of 25% or less, and flat alumina particles,
    the flat alumina particles are dispersed in the glass matrix in a direction in which individual thickness directions are substantially perpendicular to a surface direction of one of main surfaces of the inner layer part, and
    a mean aspect ratio of the flat alumina particles is 3 or more in one of cross sections along the thickness directions of the flat alumina particles out of cross sections of the inner layer part.

2. The glass ceramic substrate according to claim 1, wherein in a cross section of the inner layer part, a total cross-sectional area of the flat alumina particles, having a cross section with a thickness of 0.2 μm or more, a maximum diameter of 8 μm or less, and an aspect ratio in a range of 3 to 18 is 20% or more relative to a total area of the cross section of the inner layer part.

3. The glass ceramic substrate according to claim 1, wherein the surface layer part contains a second glass matrix.

4. The glass ceramic substrate according to claim 3, wherein the surface layer part further contains irregular ceramic particles.

5. The glass ceramic substrate according to claim 1, wherein a thickness of the surface layer part is 100 μm or less.

6. The glass ceramic substrate according to claim 1, wherein a glass constituting the first glass matrix is $SiO_2$—$B_2O_3$—$CaO$ based glass containing $Al_2O_3$ components and, 10% or more of CaO in mole percentage based on oxides when a composition of the glass excluding $Al_2O_3$ is 100%.

7. The glass ceramic substrate according to claim 6, wherein in the glass constituting the first glass matrix contains $SiO_2$, $B_2O_3$, and CaO by 75% or more in total in mole percentage based on oxides when a composition of the glass excluding $Al_2O_3$ is 100%.

8. The glass ceramic substrate according to claim 1, wherein a three-point bending strength of the glass ceramic substrate is 500 MPa or more.

9. A glass ceramic substrate, comprising:
an inner layer part having a first thermal expansion coefficient; and
a surface layer part having a second thermal expansion coefficient smaller than the first thermal expansion coefficient,
wherein a crystallinity of the glass ceramic substrate is 25% or less, and
the inner layer part contains a first glass matrix having a crystallinity of 25% or less, and flat alumina particles having a mean aspect ratio of 3 or more.

10. The glass ceramic substrate according to claim 9, wherein the flat alumina particles have a mean thickness of 0.3 μm or more, a mean major axis of 8 μm or less, and a mean aspect ratio of 3 to 18.

11. The glass ceramic substrate according to claim 9, wherein the surface layer part contains a second glass matrix.

12. The glass ceramic substrate according to claim 11, wherein the surface layer part further contains irregular ceramic particles.

13. The glass ceramic substrate according to claim 9, wherein a thickness of the surface layer part is 100 μm or less.

14. The glass ceramic substrate according to claim 9, wherein a glass constituting the first glass matrix is $SiO_2$—$B_2O_3$—$CaO$ based glass containing $Al_2O_3$ components and, 10% or more of CaO in mole percentage based on oxides when a composition of the glass excluding $Al_2O_3$ is 100%.

15. The glass ceramic substrate according to claim 14, wherein in the glass constituting the first glass matrix contains $SiO_2$, $B_2O_3$, and CaO by 75% or more in total in mole percentage based on oxides when a composition of the glass excluding $Al_2O_3$ is 100%.

16. The glass ceramic substrate according to claim 9, wherein a three-point bending strength of the glass ceramic substrate is 500 MPa or more.

17. A portable electronic device housing comprising the glass ceramic substrate according to claim 1.

18. A portable electronic device housing comprising the glass ceramic substrate according to claim 9.

* * * * *